US005147811A

United States Patent [19]

Sakagami

[11] Patent Number: 5,147,811

[45] Date of Patent: Sep. 15, 1992

[54] METHOD OF MANUFACTURING SEMICONDUCTOR DEVICE BY CONTROLLING THE PROFILE OF THE DENSITY OF P-TYPE IMPURITIES IN THE SOURCE/DRAIN REGIONS

[75] Inventor: Eiji Sakagami, Kawasaki, Japan

[73] Assignee: Kabushiki Kaisha Toshiba, Kawasaki, Japan

[21] Appl. No.: 666,912

[22] Filed: Mar. 11, 1991

[30] Foreign Application Priority Data

Mar. 13, 1990 [JP] Japan .................................. 2-61531

[51] Int. Cl.5 .................... H01L 21/22; H01L 21/266

[52] U.S. Cl. ........................................ 437/35; 437/43; 437/45; 437/150

[58] Field of Search ...................... 437/35, 36, 43, 44, 437/45, 52, 149, 150, 984

[56] References Cited

U.S. PATENT DOCUMENTS 4,232,439 11/1980 Shibata ................................ 437/35
4,771,012 9/1988 Yabu et al. ........................... 437/35

FOREIGN PATENT DOCUMENTS 333583 9/1989 European Pat. Off. .
0093279 6/1983 Japan .................................... 437/35
0061185 4/1984 Japan .................................... 437/35

OTHER PUBLICATIONS

Odanaka et al., "A New Half-Micrometer P-Channel MOSFET with Efficient Punchthrough Stops", IEEE Trans. on Electron Devices, vol. ED-33, No. 3, pp. 317-321, Mar. 1986.

Hori et al., "A New Submicron MOSFET with LATID (Large-Tilt-Angle Implanted Drain) Structure", VLSI Symp. Dig., pp. 15-16, May 1988.

Horl et al., Journal of Electronic Engineering, vol. 26, No. 267, pp. 128-131, Mar. 1989.

Patent Abstracts of Japan, vol. 6, No. 230 (E-142)(1108), Nov. 16, 1982 & JP-A-57130475 (Mitsubishi Denki) Sep. 12, 1982.

"A New Half-Micron p-Channel Mosfet with Latips." IEDM Technical Digest 1988, pp. 394-397, Takashi Hori and Kazumi Kurimoto, Dec. 11, 1988.

"Asymmetrical Halo Source GOLD drain (HS--GOLD) Deep Sub-Half Micron n-MOSFET Design For Reliability And Performance." IEDM Technical Digest 1989, pp. 617-620, T. N. Buti, S. Ogura et al., Dec. 3, 1989.

*Primary Examiner*—Brian E. Hearn
*Assistant Examiner*—C. Chaudhari
*Attorney, Agent, or Firm*—Banner, Birch, McKie & Beckett

[57] ABSTRACT

The invention provides a novel method of manufacturing a semiconductor device comprising those sequential steps including the following, formation of a floating gate electrode on a region predetermined for the formation of the first conductive channel across an insulation film, followed by superimposition of a control gate electrode on the floating gate electrode across another insulation film. After completing the formation of the stacked gate electrode unit, the first conductive impurities are injected into silicon substrate by applying a minimum of 8 degrees of angle against the normal of this substrate under aid of ionic injection, and then forms a region containing strong density of the first conductive impurities adjacent to the boundary of a layer of diffused second conductive impurities which is at least predetermined to become the drain region of the transistor incorporating the stacked gate electrode unit. As a result of the provision of the region containing strong density of impurities injected in the oblique direction, the efficiency in the writing of data into the floating gate electrode is significantly promoted, and at the same time occurrence of "short-channel" effect can securely be suppressed as well.

8 Claims, 6 Drawing Sheets

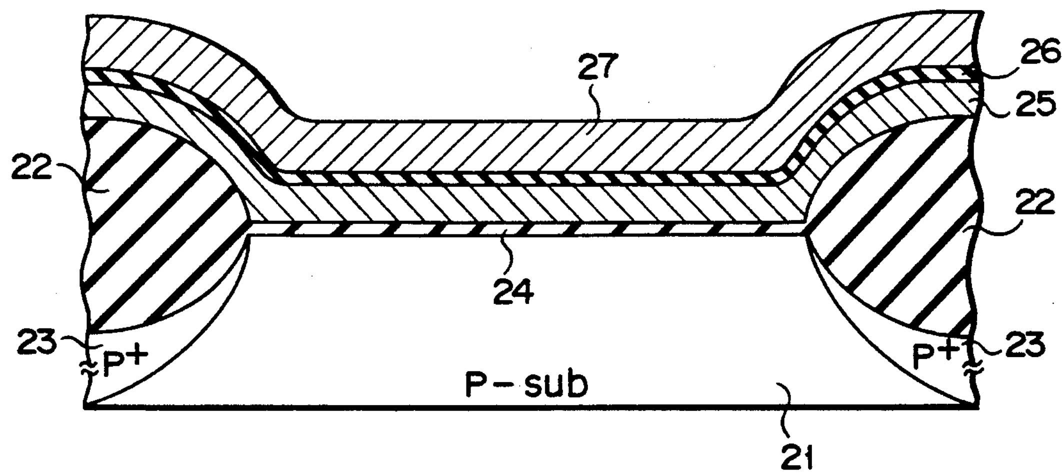
F I G. 2A

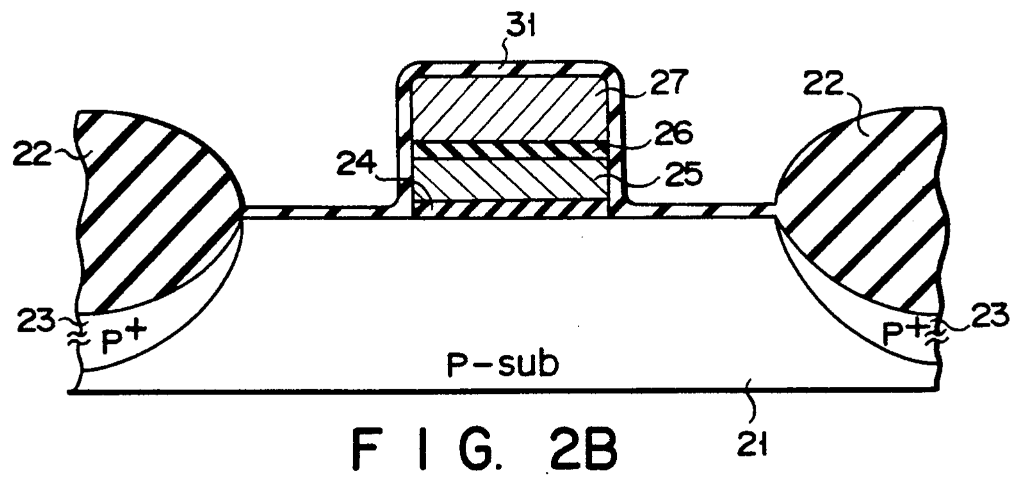
F I G. 2B
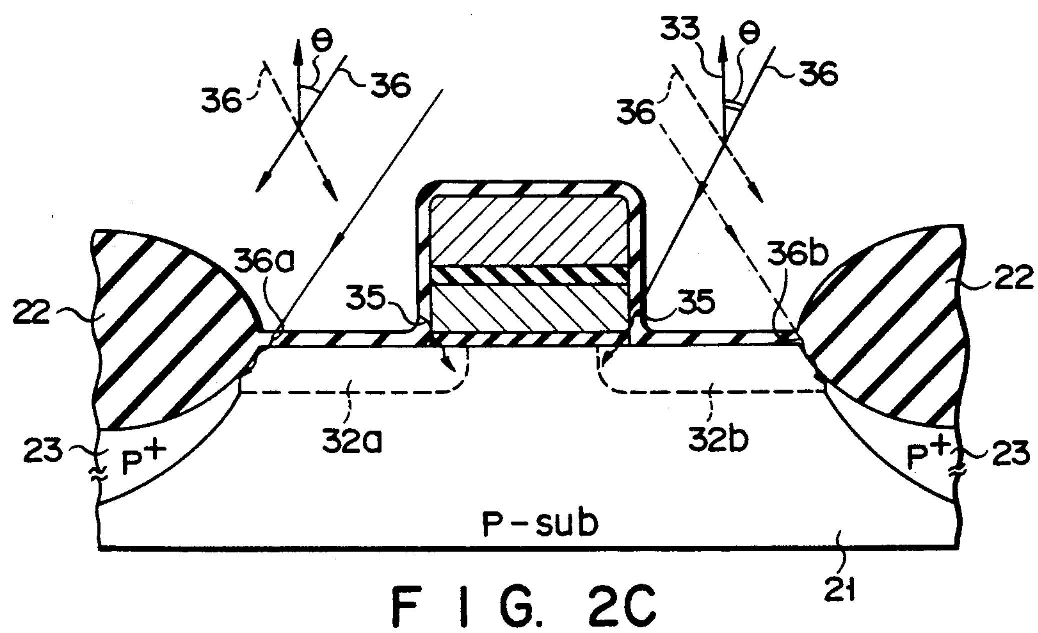
F I G. 2C
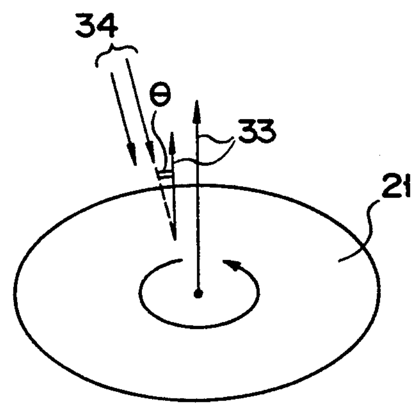
F I G. 2D

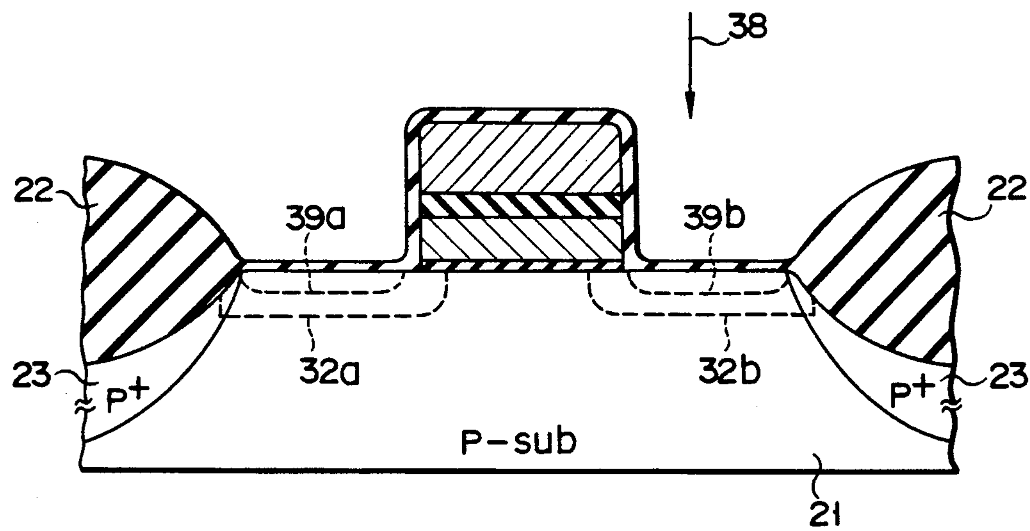
F I G. 2E
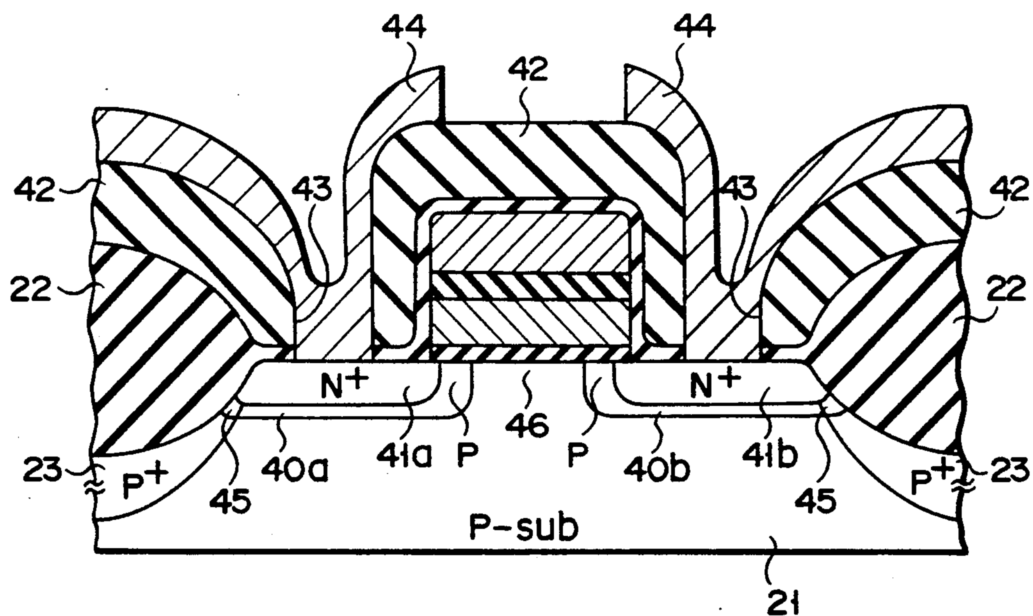
F I G. 2F

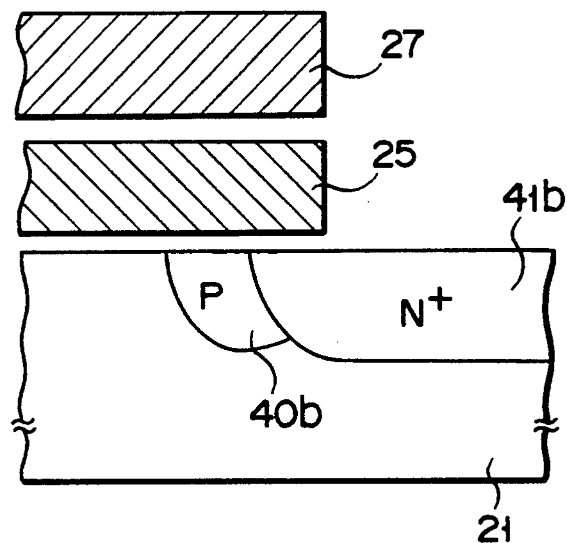
F I G. 5A
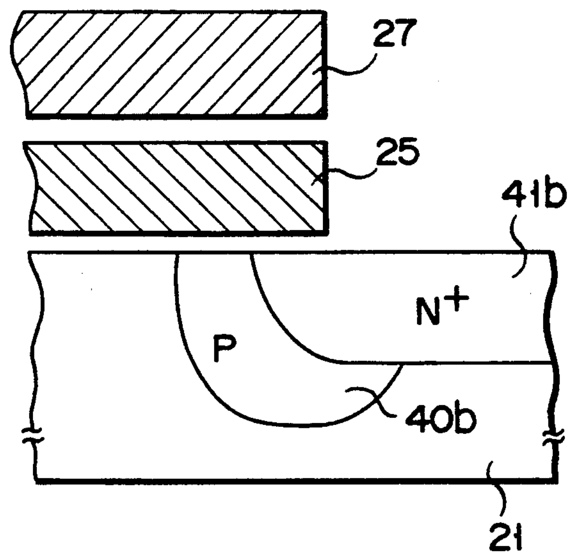
F I G. 5B

METHOD OF MANUFACTURING SEMICONDUCTOR DEVICE BY CONTROLLING THE PROFILE OF THE DENSITY OF P-TYPE IMPURITIES IN THE SOURCE/DRAIN REGIONS

BACKGROUND OF THE INVENTION

1. Field of the Invention

The present invention relates to a method of manufacturing a semiconductor device. More particularly, the invention is applicable to the formation of a floating-gate type memory cell in the manufacture of a non-volatile semiconductor memory.

2. Description of the Related Art

Recently, as a result of successful materialization of non-volatile memory units incorporating vast memory capacity, contraction of the dimension of memory cell and the data writing time is strongly urged among the concerned. To solve this problem, a proposal has been raised on the "diffusion self-aligned" (hereinafter called "DSA") structure from the standpoint of the structure of the memory cell. FIG. 1 designates a conventional non-volatile memory presented for explaining the DSA structure. The reference numeral 11 designates a P-type silicon substrate, 12 oxidized film for separation, 13*a* a source region containing N+type impurities, 13*b* a drain region containing N+type impurities, 14 a floating gate, 15 a control gate, 16 a region containing P type impurities, 17 a channel region, 18 a gate insulation film, and 19 designates an insulation film between gate electrodes, respectively. As shown in FIG. 1, according to the DSA structure, the region 16 containing P type impurities having density stronger than that is present in the center of the channel region 17 is provided. The region 16 is hereinafter merely called the "P-pocket" region. In writing data a provision of the P-pocket region 16 promotes intensity of electric field of the channel region 17 adjacent to the drain region 13*b* to allow more amount of current to flow into the floating gate 14. In particular, there is a problem inherent in the floating gate type cell transistor in terms of the resistance of the cell transistor against "punch-through" effect. Concretely, when a floating gate type field effect transistor is made available for the cell, on the way of feeding a voltage to the drain region 13*b*, due to capacitive coupling effect between the floating gate 14 and the drain region 13*b*, the potential of the floating gate 14 is lifted. As a result, unlike any single-gate type transistor, the "punch-through" effect can easily be applied to the cell transistor. The shorter the length of the gate of transistor, the easier the occurrence of this phenomenon. Actually, this makes up the most critical problem among the concerned in the effort to contract the size of the cell transistor. On the other hand, a provision of the "P-pocket" region 16 suppresses expansion of depletion, thus promoting the resistance of the cell transistor against occurrence of the "punch-through" phenomenon. This in turn advantageously promotes contraction of the size of the cell.

Due to the above reason, application of the DSA structure to the formation of the floating type memory cell transistor accelerates the speed of writing data in it, and yet, promotes the resistance of this cell transistor against occurrence of the "punch-through" phenomenon, and therefore, the DSA structure is quite essential for such a large-capacitive non volatile memory today.

In order to fully generate the proper function of an N-channel type cell transistor incorporating the DSA structure mentioned above, profile of the density of impurities in the P-pocket region 16 adjacent to an edge of the drain region 13*b* of the floating gate is particularly important. To securely promote the resistance of the cell transistor against the "punch-through" phenomenon and accelerate the data writing speed, the density of impurities in the P-pocket region 16 close to an edge of the drain region 13*b* must constantly be held stronger than that is present in the channel region 17. Nevertheless, since the P-pocket region 16 is formed by means of P-type impurities aided by injection of ions after completing the formation of stratified gate electrodes, it results in the occurrence of a problem described below.

The edge of the drain 13*b* is covered with stacked gate electrodes. When injecting ions by applying a conventional ion injection method, in order to prevent occurrence of "channeling effect", in other words, in order to prevent ion from being injected beyond a path which allows easy passage of ions, only a maximum of 7 degrees of angle is applied to the injection of ions against the normal of the silicon substrate 11, and thus, the P-type impurities cannot fully be injected into the region close to the drain region 13*b* below the floating gate 14. Because of this, actually, any conventional art injects ions needed for the formation of the P-pocket region 16, and then executes an annealing process to diffuse the P-type impurities into such region farther than the edge of the drain region 13*b* below the channel region 17 before eventually injecting ions needed for the formation of the source and drain regions 13*a* and 13*b*. In this case, an additional round of annealing process is needed for the formation of the P-pocket region 16 containing the DSA structure.

Because of this additional annealing process, the conventional art cannot simultaneously execute the double ion injection processes, and yet, an additional round of patterning process must also be executed. When providing the P-pocket region 16 by diffusing the P-type impurities as mentioned above, profile of the density of impurities cannot perfectly be controlled, and yet, enough density of the P-type impurities cannot be generated in such region close to the drain region 13*b*. Furthermore, the annealing process needed for the formation of the P-pocket region 16 gravely affects the profile of the density of the P-type impurities. Furthermore, when providing the P-pocket region 16, in order to thermally diffuse the P-type impurities in the lateral direction to full extent and maintain enough density of the impurities in the diffused region, a substantial dose of ion must be injected. This in turn expands capacity at junctions and weakens the junction breakdown voltage. In particular, the junction breakdown voltage is determined by the breakdown voltage of a high P-type impurity region formed of the overlapping portions the P-pocket region and a channel stopper region located below an isolation region, and by the breakdown voltage of the pn junction formed between the N+regions of the regions 13*a* and 13*b*. Because of this, the junction breakdown voltage is largely dependent on the distribution of the density of impurities present in those adjacent regions.

SUMMARY OF THE INVENTION

The object of the invention is to provide a novel method of manufacturing a semiconductor device which promotes the controlling of the profile of the density of P-type impurities in the drain or source regions adjoining the channel region of a stacked gate type non-volatile memory cell so that performance capability can be promoted.

The invention provides a novel method of manufacturing a semiconductor device comprising those sequential steps including the following; forming a floating gate electrode on an insulation film formed on a layer, said floating gate electrode located above that region of the layer in which a first conductivity type channel is to be formed, and forming a control gate on another insulation film formed on the floating gate electrode; and injecting ions of an impurity having a first conductivity type into a semiconductor substrate at an angle of at least 8° to the normal to the substrate, thereby to form a region having a high concentration of the first conductivity type impurity, in the vicinity of a boundary diffusion layer which contains an impurity of a second conductivity type and which is to form a drain region of a transistor having said control gate electrode.

More particularly, to achieve the above object, the method embodied by the invention characteristically executes those sequential steps including the following. The system embodied by the invention continuously or intermittently rotates the semiconductor substrate while injecting impurities into superimposed gate electrode layers in conjunction with ions for the formation of a P-pocket region; next, the system injects ions into lateral surface of the superimposed gate electrode layers by applying a minimum of 8 degrees of angle in order to promote the density of impurities in the P-pocket region adjacent to the edge of the drain region below the floating gate electrode. In contrast with the inability of any conventional art, the system embodied by the invention can securely vary voltage available for accelerating the ions injection speed and also vary the angle for injecting ion into the semiconductor substrate as well. Based on those techniques mentioned above, the system embodied by the invention simultaneously controls the profile of the density of impurities in the ion-injected region and the "short-channel" effect from occurrence, thus effectively promoting the data writing efficiency.

The system embodied by the invention injects ions into the semiconductor substrate by applying a minimum of 8 degrees and a maximum of 60 degrees of angle against the normal of this substrate. This is because, like any conventional art, if ions were injected into the substrate at a maximum of 7 degrees of angle against the normal of the substrate, then the effect of strengthening the density of impurities will be minimized in the P-pocket region adjacent to the edge of the drain region below the floating gate electrode. Injection of ion at a minimum of 8 degrees of angle initiates promotion of density of impurities beyond the conventionally available level. Conversely, if the ion injection angle exceeds 60 degrees, then difficulty is present in the effect of fully injecting ion into the substrate. Since the system embodied by the invention injects ions at a minimum of 8 degrees against the normal of the substrate, the above-cited channel effect arises. Nevertheless, since ions are deeply injected, no critical problem arises.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A through 2F are respectively explanatory of sequential steps of manufacturing the semiconductor device according to an embodiment of the invention;

FIGS. 5A and 5B respectively designate sectional views of the essential components of another embodiment of the invention.

DETAILED DESCRIPTION OF THE PREFERRED EMBODIMENTS

Figure 1:
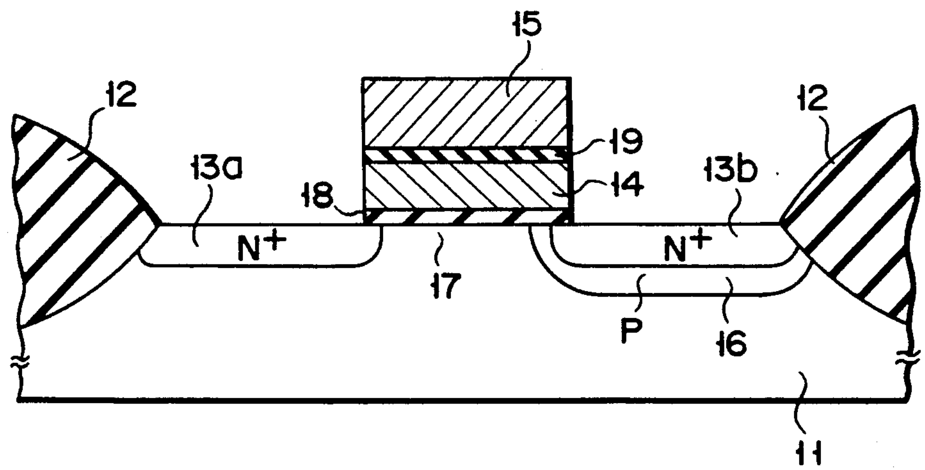
FIG. 1 designates a sectional view of a conventional non-volatile memory cell.

Referring now to the N-channel type semiconductor device shown in FIGS. 2A through 2F, the method of manufacturing an EPROM cell transistor according to an embodiment of the invention is described below.

First, as is conventionally performed, the system embodied by the invention forms a field insulation film 22 and a channel stopper region 23 on the surface of a P-type silicon substrate 21, then separates elements. Next, by applying a thermal oxidation process, the P-type silicon substrate 21 is superficially provided with a gate insulation film 24 having about 20 nm of thickness. In order to properly adjust threshold voltage of the cell transistor, conventionally, only after forming up the gate insulation film 24, ionized P-type impurities are injected into the channel region. On the other hand, since it is possible for the art embodied by the invention to properly adjust the threshold voltage of the cell transistor based on specific conditions applicable to the injection of ion into the P-pocket region (where these conditions include the injection angle, dosed amount, and accelerated voltage), actually, the art embodied by the invention forms the channel region merely by applying the P-type impurities held in the P-type silicon substrate 21 without injecting the ionized P-type impurities therein for strengthening the density.

Next, the system forms phosphor-doped polycrystalline silicon layer 25 on the gate insulation film 24, where this layer 24 is available for composing a floating gate electrode. Next, thermally oxidized film 26 having about 20 nm of thickness is formed on the polycrystalline silicon layer 25 by applying a thermal oxidation process. Then, the system forms the secondary phosphor-doped polycrystalline silicon layer 27 on the thermally oxidized film 26 (see FIG. 2A), where this layer 27 is available for composing a control gate electrode.

Next, patterning processes are sequentially executed against the secondary phosphor-doped polycrystalline silicon layer 27, the thermally oxidized film 26, and the first phosphor-doped polycrystalline silicon layer 25, respectively. As a result, stacked gate electrode unit composed of the control gate electrode 27, the second gate insulation film 26, and the floating gate electrode 25, is thus completed. Then, an oxide film 31 is formed on the stacked gate electrode unit and the surface of the P-type silicon substrate 21, respectively (see FIG. 2B).

Next, the system injects the P-type impurities into the P-type silicon substrate 21 in conjunction with ion by way of self-aligned with the stacked gate electrode unit serving as a mask, and then forms up ion-injected P-type layers 32a and 32b adjoining those regions predetermined to become source and drain regions. Ions are injected into the P-type silicon substrate 21 while continuously rotating it more than 1 round per minute by injecting more than $5 \times 10^{12} cm^{-2}$ of a dosed amount of boron by applying $10 \leqq \theta \leqq 45$ degrees of angle against the normal 33 of the silicon substrate 21 (see FIG. 2C and 2D). In this case, it is suggested that care be taken to inject ionized impurities by properly adjusting the density of impurities to be stronger than that is present in the center of the channel region and weaker than that is present in the drain region of this cell transistor.

In this case, the process of ion injection can be implemented in accordance with the method of manufacturing semiconductor device based on the condition specified by the expression shown below.

$$X_p \cdot \tan\theta \geqq X_{jl}$$

where $X_p$ designates the mean projected range of the P-type conductive impurities injected into the P-pocket region in conjunction with ions from the surface of the P-type silicon substrate; 8 designates the angle at which ions are injected against the normal of the P-type silicon substrate; and $X_{jl}$ designates the extended distance of the edge of the drain or source region as a result of elongation in the direction of the channel region below the stacked gate electrode unit by effect of diffusion until reaching the final production step after completing the ion injection process (see FIG. 3).

More particularly, the density of impurities in the P-pocket region at the edge of the drain region can sufficiently be strengthened only when the product of tan $\theta$ and the distance $X_p$ designating the mean projected range of the P-type impurities injected into the P-pocket region together with ions from the surface of the P-type silicon substrate are greater than the distance $X_{jl}$ designating the distance of the edge of the drain region diffused into the portion below the floating gate electrode. This allows the P-pocket region to fully exert own functional effect its.

In this case, if the depth $X_p$ of the injected ion coincides with the depth $X_j$ of the junction of the diffused drain layer and if the width were $X_j/2 \leqq X_p \leqq 2X_j$, then, it is possible for the embodiment of the invention to effectively strengthen the density of the P-type impurities at the largest-curvature spot of the edge of the drain region so that ideal effect can be provided for the "punch-through" of the cell transistor. This in turn effectively suppresses occurrence of "short channel" effect.

On the other hand, if the P-type impurities were not deeply injected, then it will cause the P-type impurities to be absorbed into the superficial oxidized film generated by the following thermal treatment including oxidation, thus resulting in the ineffective application of the P-type impurities.

Figure 6:
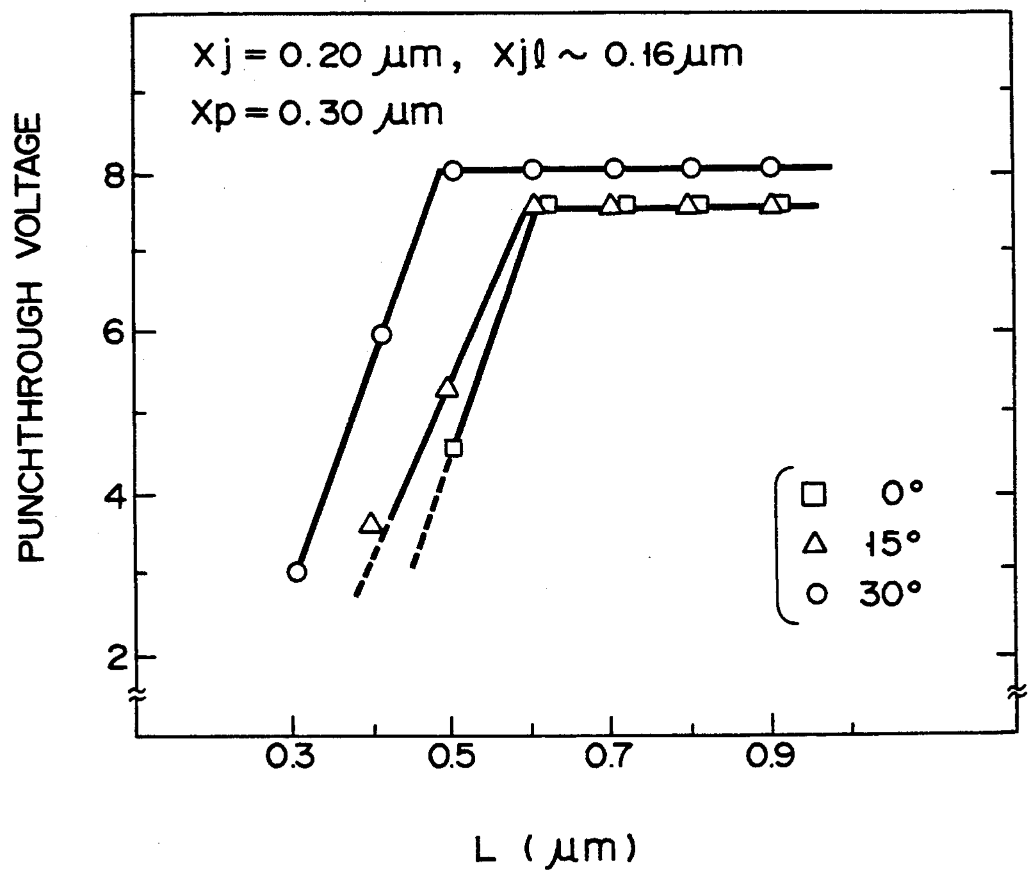
FIG. 6 is characteristic chart of the resistance of the cell transistor against occurrence of the "punch-through" phenomenon.

FIG. 6 designates the dependence of the "punch through" characteristic under a specific condition on the angel $\theta$ applied to the injection of P-type impurities, where the condition includes $X_j = 0.2$ μm, $X_{jl} = 0.16$, and $X_p = 0.30$ μm, respectively. In this case, based on the expression shown above, it is presumed that the P-pocket region is effective when the value of 8 is more than 28 degrees. As is clear from FIG. 6, when $\theta = 0°$ and $\theta = 15°$, in other words, when the P-type impurities are injected into the substrate at an angle less than 28 degrees, resistance against the "punch through" voltage sharply declines if the floating gate electrode had less than 0.6 mm of length. On the other hand, when the P-type impurities are injected into the substrate at an angle $\theta = 30°$ wider than 28°, then the resistance against the "punch through" effect is significantly improved Sufficient effect is maintained until the length of the floating gate electrode reaches 0.5 μm.

As mentioned above, the embodiment of the invention allows the P-type impurities to effectively be injected into the P-pocket region by applying a minimum of 8 degrees and a maximum of 60 degrees as well.

The reference numeral 34 shown in FIGS. 2C and 2D designates a beam of ions containing P-type impurities. The reference numeral 36a and 36b designate ionized P-type impurities injected into field edge. The reference numeral 21 designates the rotating P-type silicon substrate.

In the next step, the P-type impurities contained in the ions are injected into the substrate by way of self-aligned with the stacked gate electrode unit functioning as a mask, and then N-type ion-injected layers 39a and 39b are respectively formed. In this case, ions are injected into the P-type silicon substrate 21 so that the injection can be oriented in parallel with the lateral surface of the stacked gate electrode unit or at an angle of 7° to the normal to the surface of the silicon substrate 21. For example, $5 \times 10^{15} cm^{-2}$ of a dosed amount of ionized arsenic is injected into the silicon substrate 21. The reference numeral 38 shown in FIG. 2E designates a beam of ionized N-type impurities.

In the following step, a thermal process such as an annealing process is executed at 900° C. in order to activate ionized impurities and recover the oxidized film 24, 31 from damage incurred from the two injections of ion. At the same time, the ion-injected P-type layers 32a and 32b respectively form P-pocket regions 40a and 40b. On the other hand, the ion-injected N-type layers 39a and 39b respectively form source and drain regions 41a and 41b. In the next step, based on the conventional method of manufacturing a MOS integrated circuit, an insulation film 42 above the source and drain regions 41a and 41b is perforated to provide a contact hole 43. Next, an aluminium electrode 44 is formed, thus completing the production of an EPROM cell (see FIG. 2F). The reference numeral 45 shown in FIG. 2F designates the portion where the P-pocket region and the channel stopper region overlap each other. The reference numeral 46 designates the channel region.

According to the method of manufacturing the EPROM cell transistor mentioned above, the density of P-type impurities in the P-pocket region adjacent to the edge of the drain region can securely be strengthened, where the density of P-type impurities makes up the decisive factor of the DSA structure. As a result, the efficiency of writing data into the cell memory is promoted. Furthermore, by virtue of the contracted dimension of the cell, "short-channel" effect is improved, thus easily allowing materialization of finer size of the cell and integration of densely built circuits as well.

Figure 3:
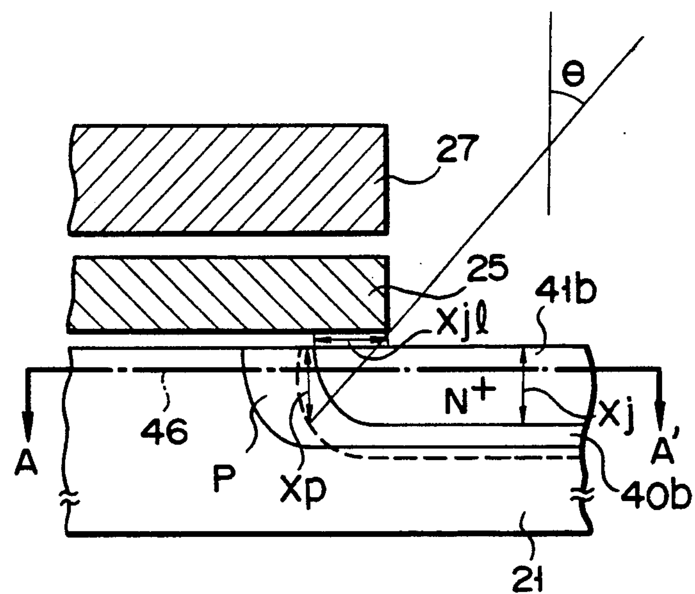
FIG. 3 designates sectional views of those regions adjacent to the drain region.
Figure 4:
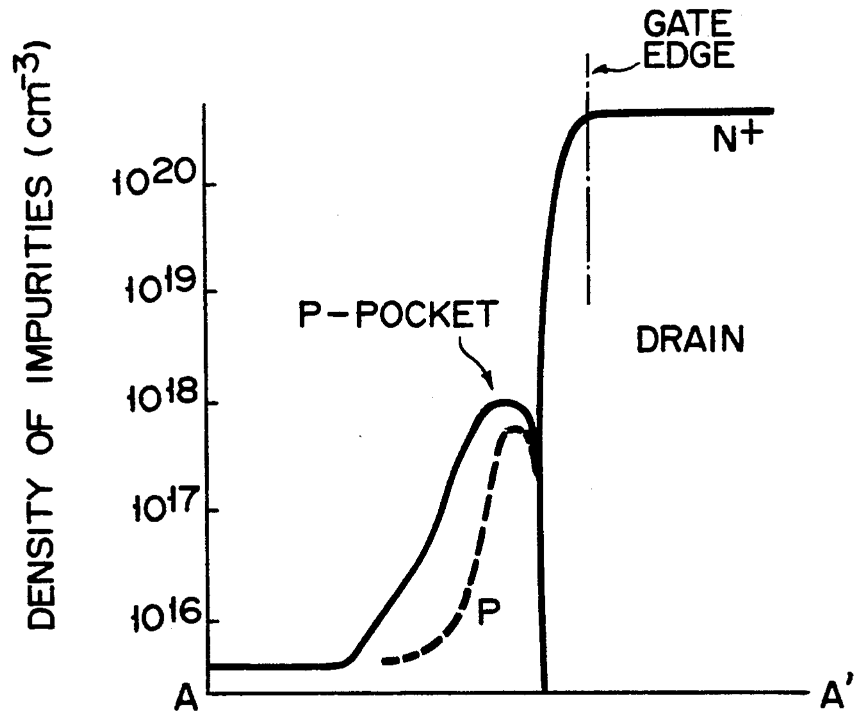
FIG. 4 graphically designates profile of the density of impurities present in the P-pocket region shown in FIG. 3.

FIG. 3 designates the sectional views of those regions adjacent to the drain edge of the cell embodied by the invention. The P-pocket region shown in FIG. 3 with a broken line designates the case in which the conventional ion injection method is applied to the formation of the P-pocket region of the above embodiment. The reference character $X_j$ shown in FIG. 3 designates the depth of the junction of the drain region 41b, whereas $X_{jl}$ designates the extended distance of the edge of the drain or source region as a result of elongation in the direction of the channel region below the floating gate electrode by the effect of diffusion until reaching the final production process after completing the ion injection process. FIG. 4 graphically designates concrete distribution of the density of impurities across the A-A' section shown in FIG. 3. The density of boron shown by means of a broken line designates the case in which the conventional ion injection method is applied to the formation of the P-pocket region of the above embodiment.

The system of manufacturing the semiconductor device according to the invention provides those useful advantages described below.

(1) The density of impurities in the P-pocket region **40*b* adjacent to the floating gate electrode 25 can be promoted to such a level stronger than that of the channel region 46. In consequence, electric field in the periphery of the drain region 41*b*** is intensified to result in the generation of a greater amount of hot electrons. This in turn promotes the efficiency of writing data into the cell memory.

(2) Owing to those advantages described in the above paragraph (1), the pn junction between the source or drain region and the P-pocket region can be composed of extremely dense impurities to prevent depletion from expanding itself. As a result, the effective length of channel in the cell transistor can fully be secured to suppress occurrence of "short-channel" effect.

(3) Owing to those advantages described in the above paragraphs (1) and (2), threshold voltage of the cell transistor can be activated merely by means of the p-pocket region, and therefore, injection of ion conventionally needed for the provision of channel for the cell transistor can be deleted.

(4) According to the method embodied by the invention, in connection with the profile of the density of P-type impurities in the P-pocket region, such a region affecting the efficiency of writing data into the memory cell, in other words, the region adjoining the drain edge below the floating gate electrode 25, and such a region affecting the "short-channel" effect, in other words, the portion adjoining the bottom of the drain region below the floating gate electrode 25, can independently be controlled by injecting ions twice in various accelerating voltages or angles for example. Accordingly, the system embodied by the invention can flexibly deal with any variation of the cell structure and variable factors generated in the course of thermal treatment after completing the formation of the cell transistor.

(5) The system embodied by the invention dispenses with the thermal process other wise needed for any conventional ion injection system to form the P-pocket region.

(6) Owing to the advantage described in the above paragraph (5), the system embodied by the invention allows a process for injecting ions for forming the P-pocket region of the cell transistor and another process for injecting ion for forming the source and drain regions of this transistor to simultaneously be executed once, thus deleting the patterning process by means of a masking process.

(7) According to the method embodied by the invention, due to transmitting or scattering at the field edge of the region 45 overlapped by the channel-stopper region 23 below the isolation region 22 and the P-pocket region 16, ions containing the P-type impurities have graded profile ranging from the surface of the substrate to the innermost region of this substrate. When obliquely injecting ions into the P-pocket region by rotating the wafer, the amount of the ionized P-type impurities injected below the field edge is maximized in the direction of the layer **36*b* in the P-pocket region of the later 32*b* for example, whereas little of the ionized P-type impurities is injected in the direction of the layer 36*a*, and thus, the density of the P-type impurities at the portion 45 overlapped by the P-pocket region 36*b* and the channel stopper region 22 is weakened (see FIG. 2C). Because of this, unlike the pn junction made as a result of forming the P-pocket region according to the conventional ion injection method, owing to the effect of weakening the density of the P-type impurities adjoining the pn junction and also owing to the effect of slackened gradient of the density of the P-type impurities, the strength of the pn junction at the portion 45** is effectively reinformed.

It should be understood that the scope of the invention is by no means confined to the embodiment thus far described, but the invention is also applicable to a variety of uses. For example, the above embodiment has formed the P-pocket region by way of covering the source and drain regions (see FIG. 2F). However, it is apparent that the P-pocket region shown in FIGS. 5A and 5B can also locally be provided via a masking process by causing the P-type silicon substrate 21 to stand still or intermittently rotate itself.

Although the description of the above embodiment has solely referred to the case of forming up the P-pocket region on both sides of the drain and source regions, it is quite apparent that the embodiment can also provide the P-pocket region solely on the part of the drain region or the source region via a masking process. Furthermore, although the above description has solely referred to the N-channel type cell transistor, the embodiment of the invention is also applicable to the P-channel type cell transistor as well.

ADVANTAGEOUS EFFECT OF THE INVENTION (1) The density of impurities in the P-pocket region adjacent to the floating gate electrode can be promoted to such a level stronger than that of the channel region. In consequence, electric field in the periphery of the drain region is intensified to result in the generation of a greater amount of hot electrons. This in turn promotes the efficiency of writing data into the cell memory.

(2) Owing to those advantages described in the above paragraph (1), the pn region between the source or drain region and the P-pocket region can be composed of extremely dense impurities to prevent depletion from expanding itself. As a result, the effective length of channel in the cell transistor can fully be secured to suppress occurrence of "short-channel" effect.

(3) Owing to those advantages described in the above paragraphs (1) and (2), operation of the cell transistor can be activated merely by means of the P-pocket region, and thus, the injection of ions conventionally needed for the provision of the channel region for the cell transistor can be deleted.

(4) According to the method embodied by the invention, in consideration of the profile of the density of P-type impurities in the P-pocket region, such a region affecting the efficiency of writing data into the cell memory and such a region affecting the "short-channel" effect can independently be controlled, and as a result, the method of manufacturing the semiconductor device embodied by the invention can flexibly deal with any variation of the cell structure and variable factors arising from thermal treatment to be done after completing the formation of the cell transistor.

(5) The system embodied by the invention dispenses with the thermal process otherwise needed for any conventional ion injection system to form the P-pocket region.

(6) Owing to the advantage described in the above paragraph (5), the system embodied by the invention allows a process for injecting ions for forming up the P-pocket region of the cell transistor and another process for injecting ion for forming the source and drain regions of this transistor to simultaneously be executed once, thus deleting the patterning process by means of a masking process.

(7) According to the system embodied by the invention, due to transmitting or scattering at the field edge of the region overlapped by the channel-stopper region below the element-separating region and the P-pocket region, ions containing the P-type impurities have graded profiles from the surface to the innermost region of the substrate. Furthermore, when obliquely injecting the ionized P-type impurities into the P-pocket region by rotating wafer, a relatively less amount of the ionized P-type impurities are injected below the field edge. In consequence, unlike the pn junction made as a result of forming the P-pocket region according to the conventional ion injection method, owing to the effect of weakening the density of the P-type impurities adjoining the p junction and also owing to the effect slackened gradient of the density of the P-type impurities, the strength of the pn junction is promoted.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a semiconductor element region on a semiconductor substrate;

forming a first insulation layer on a resulting semiconductor structure;

forming a first conductive layer on said first insulation layer;

forming a second insulation layer on said first conductive layer;

forming a second conductive layer on said second insulation layer;

patterning said insulation and conductive layers to form a floating gate electrode and a control gate electrode;

selectively injecting ions of an impurity having a first conductivity type into said element region at an angle of at least 8° relative to a normal of an upper surface of said element region;

selectively injecting ions of an impurity having a second conductivity type into said element region; and activating said impurities of the second conductivity type to form a source region and a drain region and a said impurities of the first conductivity type to form a pocket region adjacent to an edge of said drain region, wherein the step of injecting ions having an impurity of the first conductivity type is governed by the expression $$X_p \cdot \tan\theta \geqq X_{jl}$$

where $X_p$ designates a mean projected range of the ions injected into said element region, $\theta$ designates the angle at which the ions are injected relative to the normal of the upper surface of said element region, and $X_{jl}$ designates a distance that the edge of said drain region extends under said floating gate electrode.

2. A method of manufacturing a semiconductor device comprising the steps of:

forming a semiconductor element region on a semiconductor substrate;

forming a first insulation layer on a resulting semiconductor structure;

forming a first conductive layer on said first insulation layer;

forming a second insulation layer on said first conductive layer;

forming a second conductive layer on said second insulation layer;

patterning said insulation and conductive layers to form a floating gate electrode and a control gate electrode;

selectively injecting ions of an impurity having a first conductivity type into said element region at an angle of at least 8° relative to a normal of said an upper surface of said element region;

selectively injecting ions of an impurity having a second conductivity type into said element region; and activating said impurities of the second conductivity type to form a source region and a drain region and a said impurities of the first conductivity type to form a pocket region adjacent to an edge of said drain region, wherein the step of injecting ions having an impurity of the first conductivity type is governed by the expression $$\frac{1}{2}X_j \leqq X_p \leqq 2X_j$$

where $X_p$ designate a mean projected range of the ions injected into said element region, $\theta$designates the angle at which the ions are injected relative to the normal of the upper surface of said element region, and $X_j$ designates a depth of a junction of said drain region.

3. The method according to claim 1 or 2, wherein the step of activating comprises a step of activating said impurities of the first conductivity type to form a second pocket region adjacent to an edge of said source region, where $X_j$ further designates a depth of a junction of said source region and $X_{jl}$ further designates a distance that the edge of said source region extends under said floating gate electrode.

4. The method of manufacturing the semiconductor device according to claim 1 or 2, further comprising a step of adjusting a density of said impurities of the first conductivity type injected into said pocket region to be greater than a density of impurities present in a center of the channel region of said device and less than impurities present in the drain region of said device.

5. The method of manufacturing the semiconductor device according to claim 1 or 2, wherein said step of injecting ions of the impurity having the first conductivity type into said element region is executed while continuously rotating said semiconductor substrate.

6. The method of manufacturing the semiconductor device according to claim 1 or 2, wherein said step of injecting ions of the impurity having the first conductivity type into said element region is executed while intermittently rotating said substrate.

7. The method of manufacturing the semiconductor device according to claim 1 or 2, wherein said step of injecting ions of the impurity having the first conductivity type into said element region is executed at a maximum angle of sixty (60) degrees relative to the normal of the upper surface of said element region.

8. The method of manufacturing the semiconductor device according to claim 1 or 2, wherein the step of injecting ions of the impurity having the first conductivity type into said element region executed by applying a minimum of eight degrees of angle relative to the normal of the upper surface of said element region is executed simultaneously with the step of injection ions of the impurity of the second conductivity type for the formation of the source and drain regions of said device.

* * * * *